United States Patent
Otani et al.

(10) Patent No.: US 8,431,211 B2
(45) Date of Patent: Apr. 30, 2013

(54) ARTICLE HAVING LOW-REFLECTION FILM ON SURFACE OF BASE MATERIAL

(75) Inventors: Yoshimi Otani, Tokyo (JP); Satoshi Mototani, Tokyo (JP); Shuji Taneda, Tokyo (JP)

(73) Assignee: Asahi Glass Company, Limited, Tokyo (JP)

( * ) Notice: Subject to any disclaimer, the term of this patent is extended or adjusted under 35 U.S.C. 154(b) by 0 days.

(21) Appl. No.: 13/412,849

(22) Filed: Mar. 6, 2012

(65) Prior Publication Data

US 2012/0164415 A1    Jun. 28, 2012

Related U.S. Application Data

(63) Continuation of application No. PCT/JP2010/065039, filed on Sep. 2, 2010.

(30) Foreign Application Priority Data

Sep. 7, 2009   (JP) ................. 2009-205869

(51) Int. Cl.
   *G02B 1/11*   (2006.01)
   *B32B 5/16*   (2006.01)
   *B32B 7/02*   (2006.01)

(52) U.S. Cl.
   USPC ........... 428/212; 428/213; 428/323; 428/331; 428/701; 359/586

(58) Field of Classification Search .................. None
   See application file for complete search history.

(56) References Cited

U.S. PATENT DOCUMENTS

| | | | | |
|---|---|---|---|---|
| 5,733,660 A | * | 3/1998 | Makita et al. ................. | 428/426 |
| 2002/0090521 A1 | * | 7/2002 | Nakajima et al. ............. | 428/446 |
| 2006/0290409 A1 | * | 12/2006 | Noguchi et al. .............. | 327/517 |
| 2008/0124539 A1 | * | 5/2008 | Kawai et al. .................. | 428/331 |

FOREIGN PATENT DOCUMENTS

| | | |
|---|---|---|
| JP | 59-208501 | 11/1984 |
| JP | 2000-153223 | 6/2000 |
| JP | 2003-171147 | 6/2003 |
| JP | 2004-152727 | 5/2004 |

OTHER PUBLICATIONS

Machine Translation of JP2004-152727. Retrieved Jun. 13, 2012.*
Mehrotra, R.C. "Synthesis and Properties of alkoxy- and acyloxysilanes". Pure and Applied Chemistry, vol. 13, Issue 1, (1966); pp. 111-132.*
Dobrowolski, J.A. (ed. Bass et al.). "Optical Properties of Films and Coatings" Handbook of Optics: vol. I, Fundamentals, Techniques, and Design, (1995); pp. 42.19-42.34.*
International Search Report issued Oct. 5, 2010 in PCT/JP2010/065039, filed Sep. 2, 2010.

* cited by examiner

*Primary Examiner* — Maria Veronica Ewald
*Assistant Examiner* — Prashant J Khatri
(74) *Attorney, Agent, or Firm* — Oblon, Spivak, McClelland, Maier & Neustadt, L.L.P.

(57) ABSTRACT

The present invention relates to an article containing a base material and a low-reflection film formed on a surface of the base material, in which the low-reflection film contains a first layer, a second layer and a third layer in this order from the base material side, and the first layer, the second layer and the third layer have refractive indexes n1, n2 and n3, respectively, which meet the relationship of n1>n3>n2.

20 Claims, 2 Drawing Sheets

Fig. 1

Fig. 2

ARTICLE HAVING LOW-REFLECTION FILM ON SURFACE OF BASE MATERIAL

TECHNICAL FIELD

The present invention relates to an article having a low-reflection film on surface of a base material.

BACKGROUND ART

An article having a low-reflection film on surface of a base material is used as a cover glass of a solar battery, various displays and their front plates, various windowpanes, a cover glass of a touch panel and the like.

As the low-reflection film, for example, a five-layered low-reflection film obtained by laminating a low refractive index layer with a refractive index of 1.35 to 1.47 and a high refractive index layer with a refractive index of 2.0 to 2.4 alternately from base material side is known (see Patent Document 1). Also, a double-layered low-reflection film containing a lower layer with a high refractive index layer and an upper layer with a low refractive index layer is known (see Patent Document 2).

RELATED ART

Patent Document
    Patent Document 1: JP 59-208501 A
    Patent Document 2: JP 2000-153223 A

SUMMARY OF THE INVENTION

Technical Problems

The low-reflection film of Patent Document 1 exhibits, however, high reflectance unexpectedly in the near infrared region although it exhibits sufficiently low reflectance in the visible light region. Furthermore, the low-reflection film of Patent Document 2 has high wavelength dependency, and hence, although its lowest reflectance on a—reflectance curve is low, the reflectance is unexpectedly increased in the visible light region. Therefore, such conventional low-reflection films have a problem that low reflectance cannot be attained in a wide wavelength region.

The present invention provides an article having a low-reflection film exhibiting low reflectance against light in a wide wavelength region.

Solution to the Problems

The article of the invention is an article containing a base material and a low-reflection film formed on a surface of the base material, in which the low-reflection film is composed of a first layer, a second layer and a third layer disposed in this order from the base material side, and the first layer, the second layer and the third layer have a refractive index n1, a refractive index n2, and a refractive index n3, respectively, which meet the relationship of n1>n3>n2.

The first layer, the second layer and the third layer have a thickness d1, a thickness d2, and a thickness d3, respectively, which preferably meet the relationship of d1>d2>d3.

The first layer preferably contains a burned substance of a hydrolysate of alkoxysilane.

The second layer preferably contains any one species of fine particles and pyrolytic resins.

The third layer preferably contains: any one species of fine particles and pyrolytic resins; and a binder.

The low-reflection film has a lowest reflectance against light of a wavelength of 400 to 1100 nm being preferably 1.0% or less.

The base material is preferably a transparent base material.
The article is preferably a cover glass of a solar battery.

The article of another embodiment of the invention is an article containing a base material and a low-reflection film containing at least three layers formed on the base material, in which a layer with a highest refractive index out of the plural layers constituting the low-reflection film is disposed at a closest position to the base material among the plural layers constituting the low-reflection film, and a layer with a second highest refractive index out of the plural layers constituting the low-reflection film is disposed at a farthest position from the base material among the plural layers constituting the low-reflection film.

Advantageous Effects of the Invention

The article of the invention has a low-reflection film exhibiting low reflectance against light in a wide wavelength region.

MODES FOR CARRYING OUT THE INVENTION

Figure 1:
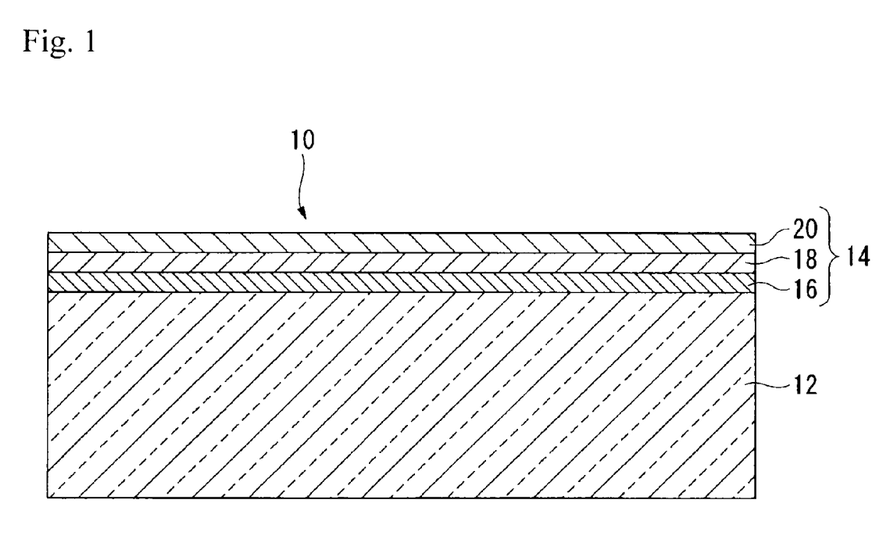
FIG. 1 is a cross-sectional view of an example of an article according to the invention.

FIG. 1 is a cross-sectional view of an example of an article according to the invention. The article 10 contains a base material 12 and a low-reflection film 14 formed on the surface of the base material 12.

(Base Material)

Materials of the base material include glass, a metal, a resin, silicon, wood, paper or the like. Examples of the glass include glass having a composition of soda-lime glass, borosilicate glass, aluminosilicate glass, no alkali glass or mixed alkali-based glass. Furthermore, there may be used not only flat glass produced by the float method or the like but also various glass such as figured glass produced through the roll-out processing by supplying molten glass between a roll member having irregularities on its surface and another roll member. Examples of the resin include polyethylene terephthalate, polycarbonate, triacetyl cellulose and poly(methyl methacrylate).

A coating film apart from the low-reflection film may be precedently formed on the base material.

The base material is in the shape of a plate, a film or the like.

In the case where the article is required for translucency (such as a cover glass of a solar battery, various displays and their front plates, various windowpanes and a cover glass of a touch panel), a transparent base material made of glass, a resin or the like is preferably used as the base material.

In the case of the soda-lime glass, which is used in construction or a vehicle, it preferably has a composition, in expression in percent by mass on an oxide basis, of $SiO_2$ of 65 to 75%, $Al_2O_3$ of 0 to 10%, CaO of 5 to 15%, MgO of 0 to 15%, $Na_2O$ of 10 to 20%, $K_2O$ of 0 to 3%, $Li_2O$ of 0 to 5%, $Fe_2O_3$ of 0 to 3%, $TiO_2$ of 0 to 5%, $CeO_2$ of 0 to 3%, BaO of 0 to 5%, SrO of 0 to 5%, $B_2O_3$ of 0 to 15%, ZnO of 0 to 5%, $ZrO_2$ of 0 to 5%, $SnO_2$ of 0 to 3%, and $SO_3$ of 0 to 0.5%. In the case of the no alkali glass, it preferably has a composition, in expression in percent by mass on an oxide basis, of $SiO_2$ of 39 to 70%, $Al_2O_3$ of 3 to 25%, $B_2O_3$ of 1 to 30%, MgO of 0 to 10%, CaO of 0 to 17%, SrO of 0 to 20%, and BaO of 0 to 30%. In the case of the mixed alkali-based glass, it preferably has a composition, in expression in percent by mass on an oxide basis, of $SiO_2$ of 50 to 75%, $Al_2O_3$ of 0 to 15%, MgO+CaO+ SrO+BaO+ZnO of 6 to 24%, and $Na_2O+K_2O$ of 6 to 24%.

As the base material of a cover glass of a solar battery, figured glass with a satin pattern having irregularities on its surface is preferably used. As the material for this figured glass, soda-lime glass (white plate glass) with a smaller ratio of iron (namely, with higher transparency) is more preferably used than soda-lime glass (blue plate glass) used for such as a general windowpane.

(Low-Reflection Film)

The low-reflection film 14 contains a first layer 16, a second layer 18 and a third layer 20 in this order from the base material 12 side.

The low-reflection film of this invention satisfies the relationship of n1>n3>n2 by the refractive index n1 of the first layer, the refractive index n2 of the second layer and the refractive index n3 of the third layer. Owing to satisfying the relationship of n1>n3>n2, the reflectance against light in a wide wavelength range is lowered and the wavelength dependency of the reflectance is reduced. In particular, since the reflectance against light of a wavelength of 400 to 1100 nm can be thus lowered, the low-reflection film of this invention is applicable to a glass to be used in a solar battery.

In the low-reflection film of this invention, as far as the relative relationship of n1>n3>n2 among the refractive indexes of the respective layers is satisfied, the values of the refractive indexes n1, n2 and n3 may be comparatively larger than the value of a refractive index required of a general low-reflection film. For suppressing the reflectance of the low-reflection film as low as possible, however, the refractive index n1 is preferably 1.50 or less, the refractive index n2 is preferably 1.30 or less and the refractive index n3 is preferably 1.40 or less. Furthermore, the low-reflection film of the invention may be formed directly on the base material or formed above the base material with a plural functional layers sandwiched therebetween. In addition, in the low-reflection film of the invention, the second layer is preferably formed directly on the first layer and the third layer is preferably formed directly on the second layer.

The refractive index ni (wherein i is an integer of 1 to 3) of each layer contained in the low-reflection film is calculated as follows: a single-layered film of the layer to be obtained the refractive index is formed on a surface of a base material; and then, in accordance with the following expression (1), the refractive index ni is calculated on the basis of the lowest reflectance against light Rmin (i.e., what is called a bottom reflectance) of the single-layered film measured with a spectrophotometer in a wavelength range of 300 to 1200 nm and the refractive index ns of the base material.

$$Rmin=(ni-ns)^2/(ni+ns)^2 \quad (1)$$

It is noted that the low-reflection film of the invention is not limited to the film containing the three layers but may contain four or more layers. In this case, a layer having the highest refractive index among all the layers composing the low-reflection film is disposed on the closest to the base material among the plural layers, and a layer having the second highest refractive index among all the layers composing the low-reflection film is disposed on the farthest from the base material among the plural layers. The other layers are disposed between the layer with the highest refractive index and the layer with the second highest refractive index. In this case, the order in the refractive index among the layers disposed between the layer with the highest refractive index and the layer with the second highest refractive index is not particularly specified.

In the low-reflection film of the invention, the thickness d1 of the first layer, the thickness d2 of the second layer and the thickness d3 of the third layer preferably satisfy a relationship of d1>d2>d3. Owing to satisfying the relationship of d1>d2>d3, the reflectance against light of a wavelength of 400 to 1100 nm may be sufficiently lowered. For suppressing the bottom reflectance to 1.0% or less and suppressing the wavelength dependency of the reflectance as low as possible, however, it is preferred to select optimum thicknesses in accordance with a combination of the refractive indexes of the respective layers through simulation described later or the like.

When, for example, n1=1.46, n2=1.25 and n3=1.36, the optimum thicknesses are d1=100 nm, d2=65 nm and d3=35 nm.

Alternatively, when n1=1.40, n2=1.10 and n3=1.30, the optimum thicknesses are d1=90 nm, d2=55 nm and d3=40 nm.

Since the optimum thicknesses of the respective layers are thus appropriately changed depending upon the combination of the refractive indexes of the layers, it is preferred that the optimum thicknesses of the respective layers are checked in changing the refractive indexes. Furthermore, when the thicknesses of the respective layers are intentionally shifted from the optimum thicknesses, the wavelength corresponding to the bottom reflectance may be set to an arbitrary wavelength.

Also, the thickness di (nm) (wherein i is an integer of 1 to 3) of each layer can be obtained through calculation using the refractive index ni of the layer to be obtained for the thickness and a wavelength λ (nm) corresponding to the bottom reflectance.

(First Layer)

The first layer may contain any material with any refractive index as far as the refractive index satisfies the relative relationship of n1>n3>n2 among the refractive indexes of the respective layers. For suppressing the reflectance of the low-reflection film as low as possible, the layer having the refractive index n1 of 1.50 or less is preferable.

Examples of the layer having the refractive index n1 of 1.50 or less include a layer containing a burned substance of a hydrolysate (sol-gel silica) of alkoxysilane, a layer containing a burned substance of silazane and a layer containing a resin (such as a thermoplastic resin, a thermosetting resin or a UV curing resin). The material for the first layer is preferably selected appropriately in accordance with the material for the base material. When the base material is made of glass, the burned substance of a hydrolysate of alkoxysilane is preferred as the material for the first layer. Furthermore, the first layer may contain, as a refractive index-lowering material, either or both of fine particles and a pyrolytic resin. Examples of the fine particles include hollow fine particles and solid fine particles. A typical example of the hollow fine particles includes hollow silica fine particles. A typical example of the solid fine particles includes solid silica fine particles. In the case of using the solid silica fine particles, the refractive index of the first layer is lowered owing to space portions formed among the solid silica fine particles. The fine particles may be present with respective particles contained therein independent of one another (i.e., dispersed), with the particles linked in a chain shape, or with the particles aggregated to one another. Here, the used amount of the refractive index-lowering material, or the average aggregated particle size is not particularly limited, and may preferably be selected appropriately as far as the refractive index n1 is 1.50 or less.

Examples of the alkoxysilane include tetraalkoxysilane (such as tetramethoxysilane, tetraethoxysilane, tetrapropoxysilane or tetrabutoxysilane), alkoxysilane having a perfluoropolyether group (such as perfluoropolyether triethoxysilane), alkoxysilane having a perfluoroalkyl group (such as perfluoroethyl triethoxysilane), alkoxysilane having a vinyl group (such as vinyl trimethoxysilane or vinyl triethoxysilane), alkoxysilane having an epoxy group (such as 2-(3,4-epoxycyclohexyl)ethyl trimethoxysilane, 3-glycidoxypropyl trimethoxysilane, 3-glycidoxypropyl methyl diethoxysilane or 3-glycidoxypropyl triethoxysilane), and alkoxysilane having an acryloyloxy group (such as 3-acryloyloxypropyl trimethoxysilane).

The hydrolysis of the alkoxysilane is performed, for example, in the case of tetraalkoxysilane, by using water in an amount of four times the molar quantity of the alkoxysilane and a catalyst of an acid or an alkali. Examples of the acid include inorganic acids (such as $HNO_3$, $H_2SO_4$ or HCl) and organic acids (such as formic acid, oxalic acid, monochloroacetic acid, dichloroacetic acid or trichloroacetic acid). Examples of the alkali include ammonia, sodium hydroxide and potassium hydroxide. As the catalyst, an acid is preferably used from the viewpoint of long storage stability of the hydrolysate of the alkoxysilane.

At this point, the hollow silica fine particle or the solid silica fine particle (hereinafter referred to as the silica fine particle) of the invention preferably has a shell of silica in general. The silica fine particle is obtained by causing a reaction between a core fine particle (or a material for a core fine particle) and a precursor of silica, or by decomposing a precursor of silica in the presence of a core fine particle for depositing/forming a shell of silica on the surface of the core fine particle. Such a method for fabricating a core-shell type fine particle can be employed a gas phase method or a liquid phase method.

Examples of the precursor of silica include one of or a mixture of two or more of substances selected from the group consisting of silicic acid, silicate and silicon alkoxide, and a hydrolysate or a polymer thereof may be used.

A specific example of the silicic acid includes silicic acid obtained by decomposing an alkali metal silicate with an acid and dialyzing the resultant, by deflocculating an alkali metal silicate, by allowing an alkali metal silicate to come into contact with an acid type cation exchange resin or by another method. Specific examples of the silicate include alkali silicates such as sodium silicate and potassium silicate, quaternary ammonium salts such as ammonium silicate and tetraethylammonium salt, and silicates of amines such as ethanol amine.

Furthermore, as the silicon alkoxide, there may be used not only ethyl silicate but also silicon alkoxide having a fluorine-containing functional group such as a perfluoropolyether group and/or a perfluoroalkyl group, or silicon alkoxide having one or two or more of functional groups selected from the group consisting of a vinyl group and an epoxy group. An example of the silicon alkoxide having a perfluoropolyether group includes perfluoropolyether triethoxysilane; an example of the silicon alkoxide having a perfluoroalkyl group includes perfluoroethyl triethoxysilane; examples of the silicon alkoxide having a vinyl group include vinyl trimethoxysilane and vinyl triethoxysilane; examples of the silicon alkoxide having an epoxy group include 2-(3,4-epoxycyclohexyl)ethyl trimethoxysilane, 3-glycidoxypropyl trimethoxysilane, 3-glycidoxypropyl methyl diethoxysilane and 3-glycidoxypropyl triethoxysilane.

Incidentally, when an acid-soluble inorganic fine particle such as a zinc oxide particle is used as the core, the pH attained in mixing the precursor of silica is preferably more than 8 because, for example, ZnO or the like dissolves when the pH is 8 or less.

(Second Layer)

The second layer may contain any material with any refractive index as far as the refractive index satisfies the relative relationship of $n1 > n3 > n2$ among the refractive indexes of the respective layers, but, for suppressing the reflectance of the low-reflection film as low as possible, the layer having the refractive index $n2$ of 1.30 or less is preferable.

The refractive index-lowering material for the second layer with the refractive index $n2$ of 1.30 or less may contain a material comprising either or both of fine particles and a pyrolytic resin. Examples of the fine particles include hollow fine particles and solid fine particles. A typical example of the hollow fine particles includes hollow silica fine particles. A typical example of the solid fine particles includes solid silica fine particles. At this point, since the second layer is required of a low refractive index, the hollow fine particles are preferably used as the fine particles. A typical example of the hollow fine particles includes hollow silica fine particles. The hollow silica fine particles may be present with respective particles contained therein independent of one another, with the particles linked in a chain shape, or with the particles aggregated to one another.

The average aggregated particle size of the hollow silica fine particles is preferably 1 to 1000 nm, more preferably 3 to 500 nm and further more preferably 5 to 300 nm. When the average aggregated particle size of the hollow silica fine particles is 1 nm or more, the reflectance of the low-reflection film is sufficiently low. When the average aggregated particle size of the hollow silica fine particles is 1000 nm or less, the haze of the low-reflection film may be suppressed to be small.

Herein, the average aggregated particle size of the fine particles of the invention means an average aggregated particle size of the fine particles in a dispersion medium and is measured by the dynamic light scattering method. Incidentally, when the fine particles are not aggregated but are monodispersed, the average aggregated particle size is equal to the average primary particle size.

The refractive index $n2$ of the second layer is preferably as low as possible for suppressing the reflectance of the low-reflection film as low as possible. Therefore, the second layer preferably consists of the hollow silica fine particles. However, since a layer consisting of the hollow silica fine particles is poor in adhesive properties to another layer, the second layer may further contain a binder. In the case where the second layer contains a binder, for suppressing increase of the refractive index $n2$, the proportion of the binder is preferably 30% by mass or less, more preferably 20% by mass or less and further more preferably 10% by mass or less in the whole material (100% by mass) of the second layer.

Examples of the binder include a burned substance of a hydrolysate (sol-gel silica) of alkoxysilane, a burned substance of silazane and a resin, among which the burned substance of a hydrolysate of alkoxysilane is preferred. As a catalyst used in the hydrolysis of alkoxysilane, a catalyst that does not disturb the dispersion of the hollow silica fine particles is preferably used.

Incidentally, even when the second layer consists of the hollow silica fine particles, a part of a binder contained in the third layer may permeate through the second layer to reach the first layer. In this case, the adhesive properties between the second layer and another adjacent layer is sufficiently exhibited, and the second layer exhibits strength sufficient for practical use.

Here, the hollow silica fine particles and the solid silica fine particles of the invention are as described above.

(Third Layer)

The third layer may contain any material with any refractive index as far as the refractive index satisfies the relative relationship of n1>n3>n2 among the refractive indexes of the respective layers, but, for suppressing the reflectance of the low-reflection film as low as possible, the layer having the refractive index n3 of 1.40 or less is preferable.

The refractive index-lowering material for the third layer with the refractive index n3 of 1.40 or less may contain a material comprising: either or both of fine particles and a pyrolytic resin; and a binder. Examples of the fine particles include hollow fine particles and solid fine particles. A typical example of the hollow fine particles includes hollow silica fine particles. A typical example of the solid fine particles includes solid silica fine particles. At this point, since the third layer is required of a higher refractive index than that of the second layer, the solid fine particles are preferably used among the fine particles. A typical example of the solid fine particles includes solid silica fine particles. The solid silica fine particles may be present with respective particles included therein independent of one another, with the particles linked in a chain shape, or with the particles aggregated to one another.

The average aggregated particle size of the solid silica fine particles is preferably 1 to 1000 nm, more preferably 3 to 500 nm and further more preferably 5 to 300 nm. When the average aggregated particle size of the solid silica fine particles is 1 nm or more, the reflectance of the low-reflection film is sufficiently low. When the average aggregated particle size of the solid silica fine particles is 1000 nm or less, the haze of the low-reflection film may be suppressed to be small.

Examples of the binder include a burned substance of a hydrolysate (sol-gel silica) of alkoxysilane, a burned substance of silazane and a resin, among which the burned substance of a hydrolysate of alkoxysilane is preferred. As a catalyst used in the hydrolysis of alkoxysilane, a catalyst that does not disturb the dispersion of the solid silica fine particles is preferably used. The used amount of the binder is not particularly limited, and may preferably be selected appropriately as far as the refractive index satisfies the relative relationship of n1>n3>n2.

Here, the hollow silica fine particles and the solid silica fine particles of the invention are as described above.

(Another Layer)

The article of the invention may contain another functional layer (such as an adhesion-improving layer, a protection layer or a coloring layer) as far as the effects of the invention are not spoiled. However, from the viewpoint of the productivity and durability, the article preferably consists of low-reflection film on the base material.

(Method for Producing the Article)

The article of the invention can be produced, for example, by successively applying coating compositions for forming the respective layers on the base material, preheating the resultant as necessary and baking the resultant ultimately.

Examples of a coating composition (A) used for forming the first layer include a solution of a hydrolysate of alkoxysilane, a solution of silazane and a solution of a resin. As a solvent of the solution of a hydrolysate of alkoxysilane, a mixed solvent of water and alcohols (such as methanol, ethanol, isopropanol, butanol or diacetone alcohol) is preferable. The coating composition (A) may contain a material comprising either or both of a fine particle dispersion (a hollow silica fine particle dispersion or a solid silica fine particle dispersion) and a pyrolytic resin solution.

An example of a coating composition (B) used for forming the second layer includes a hollow silica fine particle dispersion, which may contain as necessary, a solution of a binder or its precursor (such as a solution of a hydrolysate of alkoxysilane, a solution of silazane or a solution of a resin). Examples of a dispersion medium of the hollow silica fine particle dispersion include water, alcohols, ketones, ethers, cellosolves, esters, glycol ethers, nitrogen-containing compounds and sulfur-containing compounds. The coating composition (B) may contain either or both of a hollow silica fine particle dispersion and a pyrolytic resin solution. Furthermore, a solid silica fine particle dispersion may be added instead of the hollow silica fine particle dispersion.

An example of a coating composition (C) used for forming the third layer includes a mixture of a fine particle dispersion (such as a hollow silica fine particle dispersion or a solid silica fine particle dispersion) and a solution of a binder or its precursor. The coating composition (C) may contain a pyrolytic resin solution.

The coating composition (C) preferably contains a terpene derivative. Owing to containing a terpene derivative, a space is formed around a silica fine particle after baking, so as to sufficiently lower the refractive index of the third layer.

Terpene means carbon hydride having a composition of $(C_5H_8)_n$ (wherein n is an integer of 1 or more) having isoprene $(C_5H_8)$ as a constituent unit. The terpene derivative means a terpene having a functional group derived from terpene. The terpene derivative for use in the invention includes one having a different degree of unsaturation.

As the terpene derivative, a terpene derivative having a hydroxyl group and/or a carbonyl group in a molecule is preferable, a terpene derivative having, in a molecule, one or more groups selected from the group consisting of a hydroxyl group, an aldehyde group (—CHO), a keto group (—C(=O)—), an ester bond (—C(=O)O—) and a carboxy group (—C(=O)OH) is more preferable, and a terpene derivative having, in a molecule, one or more groups selected from the group consisting of a hydroxyl group, an aldehyde group and a keto group is further more preferable.

Examples of the terpene derivative include terpene alcohol (such as α-terpineol, terpinen 4-ol, L-menthol, (±) citronellol, myrtenol, borneol, nerol, farnesol and phytol), terpene aldehyde (such as citral, β-cyclocitral and perillaldehyde), terpene ketone (such as (±) camphor and β-ionone), terpene carboxylic acid (such as citronellic acid and abietic acid) and terpene ester (such as terpinyl acetate and menthyl acetate).

Each of the coating compositions may contain a surface active agent for improving the leveling property, a metal compound for improving the durability of the coated film, and the like.

Alternatively, a coating composition (D) containing a dispersion medium (a) and fine particles (b) may be used in place of the coating composition (C). At this point, the coating composition (D) contains, as a part or the whole of the dispersion medium (a), a compound (a1) that is insoluble or slightly soluble in water and has a hydroxyl group and/or a carbonyl group. It is noted that being insoluble or slightly soluble in water means that solubility in water at 20° C. is 5% by mass or less. Examples of the carbonyl group include at least one or more groups selected from the group consisting of an aldehyde group, a keto group, an ester bond and a carboxy group. The coating composition (D) further can contain a binder (d) and another additive if necessary. Moreover, the coating composition (D) may contain the aforementioned terpene derivative.

(Dispersion Medium (a))

Examples of the dispersion medium (a) (whereas excluding the terpene derivatives) include water, alcohols (such as methanol, ethanol, isopropanol, butanol and diacetone alcohol), ketones (such as acetone, methyl ethyl ketone and methyl isobutyl ketone), ethers (such as tetrahydrofuran and 1,4-dioxane), cellosolves (such as methyl cellosolve and ethyl cellosolve), esters (such as methyl acetate and ethyl acetate), glycol ethers (such as ethylene glycol monoalkyl ether), nitrogen-containing compounds (such as N,N-dimethylacetamide, N,N-dimethyl sulfoxide and N-methyl pyrrolidone) and sulfur-containing compounds (such as dimethyl sulfoxide).

(Fine Particles (b))

Examples of the fine particles (b) include metal oxide fine particles, metal fine particles, pigment-based fine particles and resin fine particles. Examples of the material for the metal oxide fine particles include $Al_2O_3$, $SiO_2$, $SnO_2$, $TiO_2$, $ZrO_2$, ZnO, $CeO_2$, Sb-containing $SnO_x$(ATO), Sn-containing $In_2O_3$ (ITO) and $RuO_2$. Examples of the material for the metal fine particles include metals (such as Ag and Ru) and alloys (such as AgPd and RuAu). Examples of the pigment-based fine particles include inorganic pigments (such as titanium black and carbon black) and organic pigments. Examples of the material for the resin fine particles include polystyrene and melamine resin.

The fine particles (b) may be in a spherical shape, an oval shape, a needle shape, a plate shape, a bar shape, a cone shape, a column shape, a cubic shape, a cuboid shape, a diamond shape, a star shape, an indeterminate shape or the like. Furthermore, the fine particles (b) may be hollow or perforated. Moreover, the fine particles (b) may be present with respective particles included therein independent of one another, with the particles linked in a chain shape, or with the particles aggregated to one another. As the fine particles (b), one kind of fine particles may be singly used or two or more kinds of fine particles may be used together.

The average aggregated particle size of the fine particles (b) is preferably 1 to 1000 nm, more preferably 3 to 500 nm and further more preferably 5 to 300 nm. When the average aggregated particle size of the fine particles (b) is 1 nm or more, an anti-reflection effect is sufficiently high. When the average aggregated particle size of the fine particles (b) is 1000 nm or less, the haze of the coated film may be suppressed to be small.

The average aggregated particle size of the fine particles (b) corresponds to the average aggregated particles size thereof obtained in the dispersion medium (a) and is measured by a dynamic light scattering method. Incidentally, when the fine particles (b) are not aggregated but are monodispersed, the average aggregated particle size is equal to the average primary particle size.

(Compound (a1))

Examples of the compound (a1) include benzyl alcohol (3.8% by mass), 1-decyl alcohol (0.02% by mass), 1-decanal (insoluble in water), heptyl alcohol (0.35% by mass), 1-octyl alcohol (0.05% by mass), 1-dodecyl alcohol (insoluble in water), tetradodecyl alcohol (insoluble in water), 1,2-octanediol (insoluble in water), 1,2-decanediol (insoluble in water), 1,2-dodecanediol and O-cresol (2.2% by mass). It is noted that the percentage by mass put in parentheses following each compound corresponds to the solubility of the compound in water at 20° C.

As the coating method, any of known wet coating methods (such as the spin coating, the spray coating, the dip coating, the die coating, the curtain coating, the screen coating, the inkjet method, the flow coating, the gravure coating, the bar coating, the flexographic coating, the slit coating and the roll coating), the electrostatic coating such as the electrostatic spray, and the like may be employed.

The coating temperature is preferably room temperature to 80° C. and more preferably room temperature to 60° C.

The baking temperature is preferably 30° C. or more and may be appropriately determined in accordance with the material for the base material, the fine particles or the binder.

For example, when the material for the base material, the fine particles or the binder is a resin, the baking temperature is not more than the heatproof temperature of the resin, and a sufficient antireflection effect may be attained even through the baking at such a temperature.

When the base material is made of glass, the baking process for the coating film may be performed also as a physically reinforcing process for the glass. In the physically tempering process, the glass is heated nearly to the softening temperature. In this case, the baking temperature is set to approximately 600 to 700° C.

In general, the baking temperature is preferably not more than the heat distortion temperature of the base material. The lower limit of the baking temperature can be theoretically set to a temperature close to room temperature as far as there is no restriction in time.

Incidentally, the method for producing the article of the invention is not limited to the aforementioned methods, but the layers may be formed by any of dry coating methods (such as the sputter coating), the CVD or the like in accordance with the materials composing the layers.

In the article of the invention described so far, the low-reflection film is composed of the first layer, the second layer and the third layer disposed in this order from the base material side, and the refractive index n1 of the first layer, the refractive index n2 of the second layer and the refractive index n3 of the third layer satisfy the relationship of n1>n3>n2, and therefore, the reflectance against light of a wavelength of 400 to 1100 nm is low and also the wavelength dependency of the reflectance is small. Accordingly, the article of the invention is in particularly preferably used in a solar battery.

Furthermore, when the first layer is a layer made of a burned substance of a hydrolysate of alkoxysilane, the second layer is a layer containing hollow silica fine particles and the third layer is a layer containing fine particles and a binder (in particular, a layer obtained by baking a coated layer of a coating composition including fine particles, a hydrolysate of alkoxysilane and a terpene derivative), the low-reflection film may be formed at a comparatively low temperature, the base material to be used is not strictly limited and the cost is comparatively low.

EXAMPLES

The present invention will now be illustrated in more detail with reference to Examples.

In the following description, Examples 1 to 3 are computational examples, Examples 4 through 6 are invention examples and Example 7 is a comparative example.

(Simulation)

Simulation was carried out on the basis of the refractive index of a base material, and the refractive indexes and the thicknesses of respective layers of a low-reflection film, so as to obtain reflectance against light of a wavelength of 400 to 1100 nm.

(Thickness of Shell and Diameter of Hole of Hollow Fine particles)

The thickness of a shell and the diameter of a hole of hollow fine particles were obtained as follows: A dispersion of hollow fine particles was diluted with ethanol into 0.1% by mass, the thus diluted dispersion was sampled on a collodion film for observing with a transmission electron microscope (manufactured by Hitachi Ltd.; H-9000), 100 hollow fine particles were selected at random for measuring the thicknesses of the shells and the diameters of the holes of the respective hollow fine particles, and averages of the thicknesses of the shells and the diameters of the holes of the 100 fine particles were obtained as the thickness of the shell and the diameter of the hole of the hollow fine particles.

(Average Primary Particle Size of Fine particles)

The average primary particle size of the hollow fine particles was obtained as follows: A dispersion of hollow fine particles was diluted with ethanol into 0.1% by mass, the thus diluted dispersion was sampled on a collodion film for observing with a transmission electron microscope (manufactured by Hitachi Ltd.; H-9000), 100 hollow fine particles were selected at random for measuring the particle sizes of the respective fine particles, and an average of the particle sizes of the 100 fine particles was obtained as the average primary particle size of the hollow fine particles.

An average primary particle size of fine particles other than the hollow fine particles was calculated, on the assumption that spherical particles are homogeneously dispersed in a dispersion medium, through conversion on the basis of a specific surface area measured by the BET and the volume of the spherical particle.

(Average Aggregated Particle Size of Fine particles)

The average aggregated particle size of fine particles was measured by using a dynamic light scattering particle size analyzer (manufactured by Nikkiso Co., Ltd.; Microtrac UPA).

(Refractive Index)

The refractive index ni (wherein i is an integer of 1 to 3) was calculated as follows: a single-layered film of the layer to be obtained the refractive index is formed on a surface of a base material, and then, in accordance with the following expression (1), the refractive index ni is calculated on the basis of the bottom reflectance Rmin of the single-layered film measured with a spectrophotometer and the refractive index ns of the base material.

$$Rmin=(ni-ns)^2/(ni+ns)^2 \qquad (1)$$

(Reflectance)

After adhering a black plastic tape onto a surface of a base material on the other side of a low-reflection film so as not to form an air bubble therebetween, reflectance on the low-reflection film in a portion with a size of 100 mm×100 mm positioned at the center of the base material was measured. The reflectance was measured in a wavelength of 300 to 1200 nm, and a bottom reflectance and an average reflectance were obtained. When the bottom reflectance was 380 nm or less or 780 nm or more, a spectrophotometer (manufactured by Jasco Corporation; V670) was used. When the bottom reflectance was 380 to 780 nm, a spectrophotometer (manufactured by Otsuka Electronics Co., Ltd.; Multi Channel Photo Detector MCPD-3000) was used. Here, the bottom reflectance was defined as the minimum value of the reflectance in wavelength range from 300 to 1200 nm. The average reflectance is defined as a value obtained from arithmetic average of the reflectance in wavelength range from 300 to 1200 nm.

(Transmittance)

The transmittance of a low-reflection film was measured with a wavelength of 400 nm through 1100 nm by using a spectrophotometer (manufactured by Jasco Corporation; V670).

Preparation of Binder Solution (i):

While stirring 85.7 g of denatured ethanol (manufactured by Japan Alcohol Trading Co., Ltd.; Solmix AP-11, that is, a mixed solvent containing ethanol as a base compound; the same shall apply hereinafter), a mixed solution of 6.6 g of ion-exchanged water and 0.1 g of 61 mass % nitric acid was added thereto, and the thus obtained mixture was stirred for 5 minutes. To the resultant, 7.6 g of tetraethoxysilane (with a solid content converted to a $SiO_2$ basis of 29% by mass) was added, the thus obtained mixture was stirred for 30 minutes at room temperature, thereby preparing a binder solution (i) with a solid content converted to a $SiO_2$ basis of 2.2% by mass. It is noted that a solid content converted to a $SiO_2$ basis means a solid content obtained by assuming that whole Si of the tetraethoxysilane is converted to $SiO_2$.

Preparation of Hollow $SiO_2$ Fine Particle Dispersion (ii):

While stirring 29.07 g of denatured ethanol, 39 g of water, 21 g of a ZnO fine particle aqueous dispersion (manufactured by Ishihara Sangyo Kaisha Ltd.; FZO-50, with a solid content of 20% by mass, an average primary particle size of 21 nm and an average aggregated particle size of 40 nm) and 10 g of tetraethoxysilane (with a solid content converted to a $SiO_2$ basis of 29% by mass) were added thereto, and the pH of the resultant dispersion was adjusted to 10 by further adding 0.75 g of a 28% by mass ammonia aqueous solution thereto, and the resultant was stirred for 4.5 hours at 20° C. To the thus obtained solution, 0.18 g of zirconium tetraacetyl acetonate (manufactured by Kanto Chemical Co., Inc.) was added, and the resultant was stirred for 1.5 hours, so as to give 100 g of a core-shell type fine particle dispersion (with a solid content of 7.2% by mass).

Then, 100 g of a strong acidic cation exchange resin (manufactured by Mitsubishi Chemical Corporation; Diaion, with total capacity of 2.0 mseq/mL or more) was added to the thus obtained core-shell type fine particle dispersion, and after attaining pH 4 by stirring the resultant mixture for 1 hour, the strong acidic cation exchange resin was removed through filtering, so as to give 100 g of a hollow $SiO_2$ fine particle dispersion with a solid content converted to a $SiO_2$ basis of 3% by mass. The thickness of the shell of the hollow $SiO_2$ fine particle was 6 nm, the diameter of its hole was 30 nm, and the average aggregated particle size was 50 nm. The hollow $SiO_2$ fine particle dispersion was concentrated by using an ultrafiltration membrane, so as to give a hollow $SiO_2$ fine particle dispersion (ii) with a solid content converted to a $SiO_2$ basis of 12% by mass.

Chain $SiO_2$ Fine Particle Dispersion (iii):

Manufactured by Nissan Chemical Industries Ltd.; Snowtex OUP, with a solid content of 15.5% by mass and an average aggregated particle size of 40 to 100 nm.

$TiO_2$ Fine Particle Dispersion (iv):

Manufactured by Ishihara Sangyo Kaisha Ltd.; STS-01, with a solid content of 30% by mass.

Preparation of Coating Composition (A1):

While stirring 85.7 g of denatured ethanol, a mixed solution of 6.6 g of ion-exchanged water and 0.1 g of 61% by mass nitric acid was added thereto, and the thus obtained mixture was stirred for 5 minutes. To the resultant, 7.6 g of tetraethoxysilane (with a solid content converted to a $SiO_2$ basis of 29% by mass) was added, and the resultant was stirred for 30 minutes at room temperature, thereby preparing a coating composition (A1) with a solid content converted to a $SiO_2$ basis of 2.2% by mass. The coating composition (A1) was applied on a surface of a glass plate (manufactured by Asahi Glass Co., Ltd.; FL3.5, soda-lime glass with a refractive index ns of 1.53) under the same conditions as in Examples 4 to 6 described below, so as to be formed into a single-layered film through baking, and the refractive index was measured. The results are listed in Table 2 below.

Preparation of Coating Composition (B1):

While stirring 55.7 g of denatured ethanol, 5.3 g of the hollow $SiO_2$ fine particle dispersion (ii) was added thereto, and 24.0 g of 2-butanol and 15.0 g of diacetone alcohol (hereafter, referred to as DAA) were further added thereto, thereby preparing a coating composition (B1) with a solid content of 0.6% by mass. The composition is listed in Table 1 below. Furthermore, the coating composition (B1) was applied on a surface of a glass plate (with a refractive index ns of 1.53) under the same conditions as in Examples 4 and 5 described below, so as to be formed into a single-layered film through baking, and the refractive index was measured. The results are listed in Table 2 below.

Preparation of Coating Composition (C1):

While stirring 40.1 g of denatured ethanol, 24.0 g of 2-butanol, 16.4 g of the binder solution (i) and 3.5 g of the chain $SiO_2$ fine particle dispersion (iii) were added thereto, and 15.0 g of diacetone alcohol and 1.0 g of α-terpineol were further added thereto, thereby preparing a coating composition (C1) with a solid content of 0.9% by mass. The composition is listed in Table 1 below. Furthermore, the coating composition (C1) was applied on a surface of a glass plate (with a refractive index ns of 1.53) under the same conditions as in Examples 4 to 6 described below, so as to be formed into a single-layered film through baking, and the refractive index was measured. The results are listed in Table 2 below.

Preparation of Coating Composition (B2):

While stirring 49.8 g of denatured ethanol, 24.0 g of 2-butanol, 5.9 g of the binder solution (i) and 5.3 g of the hollow $SiO_2$ fine particle dispersion (ii) were added thereto, and 15.0 g of diacetone alcohol was further added thereto, thereby preparing a coating composition (B2) with a solid content of 0.8% by mass. The composition is listed in Table 1 below. Furthermore, the coating composition (B2) was applied on a surface of a glass plate (with a refractive index ns of 1.53) under the same conditions as in Example 6 described below, so as to be formed into a single-layered film through baking, and the refractive index was measured. The results are listed in Table 2 below.

Preparation of Coating Composition (E):

While stirring 60.0 g of denatured ethanol, 24.0 g of 2-butanol and 1.0 g of the $TiO_2$ fine particle dispersion (iv) were added thereto, and 15.0 g of diacetone alcohol was further added thereto, thereby preparing a coating composition (E) with a solid content of 0.3% by mass. The composition is listed in Table 1 below. Furthermore, the coating composition (E) was applied on a surface of a glass plate (with a refractive index ns of 1.53) under the same conditions as in Example 7 described below, so as to be formed into a single-layered film through baking, and the refractive index was measured. The results are listed in Table 2 below.

EXAMPLE 1

Figure 2:
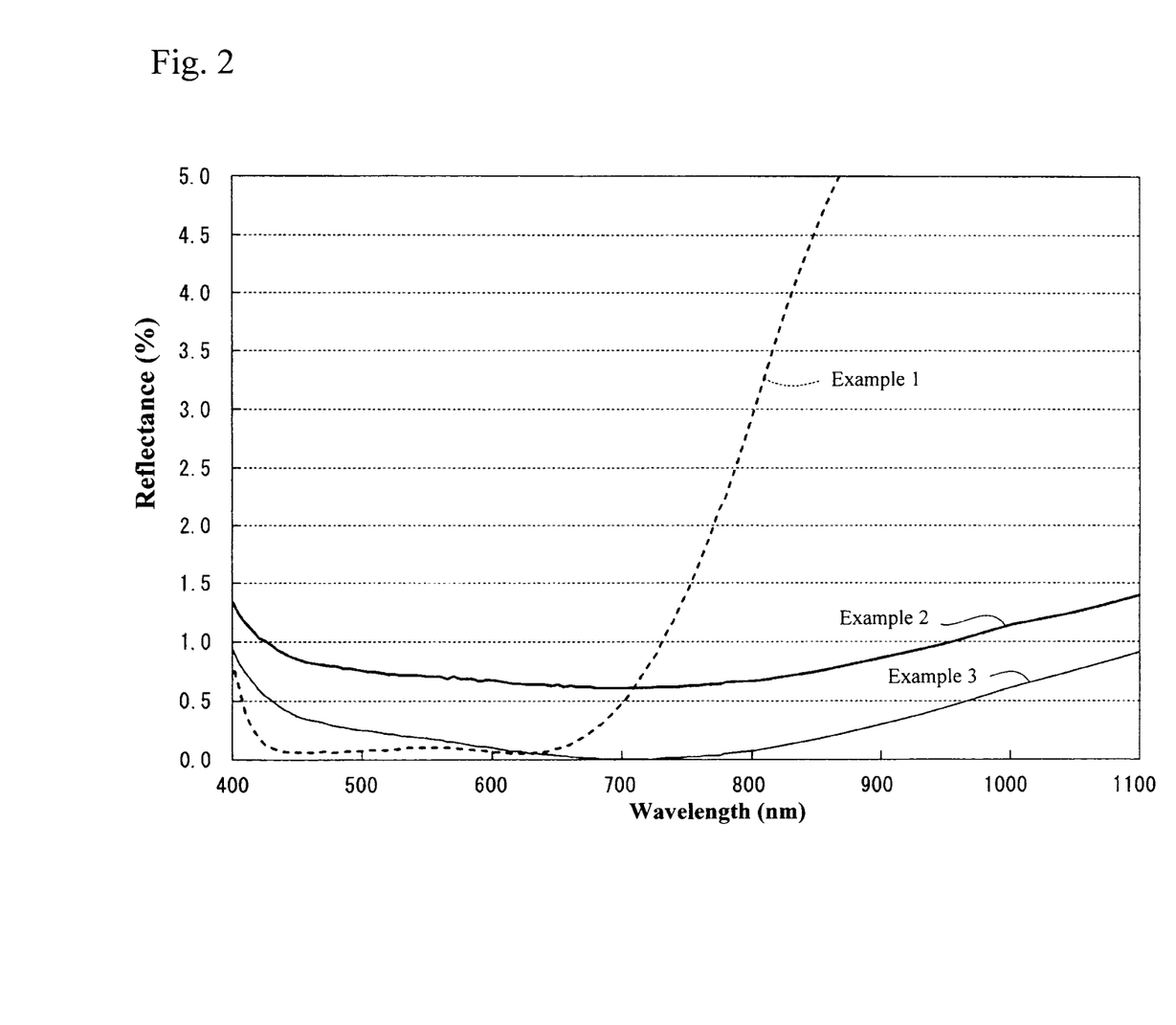
FIG. 2 is a graph illustrating a result of simulation for reflectance performed in Examples 1 to 3.

Assuming an article (corresponding to that of Patent Document 1) containing a low-reflection film having a five-layered structure consisting of a low refractive index layer (with a refractive index n1 of 1.38 and a thickness d1 of 27 nm), a high refractive index layer (with a refractive index n2 of 2.08 and a thickness d2 of 19 nm), a low refractive index layer (with a refractive index n3 of 1.38 and a thickness d3 of 36 nm), a high refractive index layer (with a refractive index n4 of 2.08 and a thickness d4 of 134 nm) and a low refractive index layer (with a refractive index n5 of 1.38 and a thickness d5 of 94 nm) in this order from a glass plate (with a refractive index ns of 1.53) side, the simulation for reflectance was performed. The result is illustrated in FIG. 2.

EXAMPLE 2

Assuming an article containing a low-reflection film having a three-layered structure consisting of a first layer (with a refractive index n1 of 1.46 and a thickness d1 of 100 nm), a second layer (with a refractive index n2 of 1.25 and a thickness d2 of 65 nm) and a third layer (with a refractive index n3 of 1.36 and a thickness d3 of 35 nm) in this order from a glass plate (with a refractive index ns of 1.53) side, the simulation for reflectance was performed. The result is illustrated in FIG. 2.

EXAMPLE 3

Assuming an article containing a low-reflection film having a three-layered structure consisting of a first layer (with a refractive index n1 of 1.40 and a thickness d1 of 90 nm), a second layer (with a refractive index n2 of 1.10 and a thickness d2 of 55 nm) and a third layer (with a refractive index n3 of 1.30 and a thickness d3 of 40 nm) in this order from a glass plate (with a refractive index ns of 1.53) side, the simulation for reflectance was performed. The result is illustrated in FIG. 2.

It is understood, from the results illustrated in FIG. 2, that the articles of Examples 2 and 3 each containing the low-reflection films having the three-layered structure consisting of the first layer, the second layer and the third layer laminated in this order from the base material side, and respectively having a refractive index n1 of the first layer, a refractive index n2 of the second layer and a refractive index n3 of the third layer satisfying the relationship of n1>n3>n2 have low reflectance against light of a wavelength of 400 to 1100 nm and have low wavelength dependency of the reflectance.

On the other hand, it is understood that the article of Example 1 containing the low-reflection film having the five-layered structure in which the low refractive index layers with a refractive index of 1.38 and the high refractive index layers with a refractive index of 2.08 are alternately laminated from the base material side exhibits sufficiently low reflectance in the visible light region but its reflectance is unexpectedly increased in the near infrared region beyond a wavelength of 700 nm.

EXAMPLE 4

Figured glass (manufactured by Asahi Glass Co., Ltd.; Solite, that is, soda-lime glass with a small iron content (white plate glass), with a size of 100 mm×100 mm and a thickness of 3.2 mm) was prepared as a base material, the surface (smooth surface) of the figured glass was polished with a cerium oxide aqueous dispersion, and after washing away cerium oxide with water, the glass was rinsed with ion-exchanged water and dried.

The figured glass was set at room temperature on a support provided in a booth where a spray coating robot (manufactured by Kawasaki Robotics; JE005F) was installed, and 160 cc of the coating composition (A1) was applied thereon by the spray coating. After the coating, the figured glass was preheated in a preheating oven (manufactured by Kusumoto Chemicals Ltd.; ETACHT320), and while keeping the temperature on the support, 100 cc of the coating composition (B1) was applied thereon by the spray coating. Subsequently, the coated figured glass was preheated in the preheating oven again, and while keeping the temperature on the support, 70 cc of the coating composition (C1) was applied thereon by the spray coating. Thereafter, the resultant figured glass was baked, thereby obtaining an article on which a low-reflection film was formed. The article was evaluated. The result is listed in Table 2 below.

EXAMPLE 5

An article containing a low-reflection film was obtained in the same manner as in Example 4 except that the applied amount of the coating composition (B1) was 1.2 times as large as that of Example 4. The article was evaluated. The result is listed in Table 2 below.

EXAMPLE 6

An article containing a low-reflection film was obtained in the same manner as in Example 5 except that the coating composition (B1) was replaced with the coating composition (B2). The article was evaluated. The result is listed in Table 2 below.

EXAMPLE 7

Figured glass was prepared in the same manner as in Example 4.

The figured glass kept at room temperature was set on a spin coater (manufactured by Mikasa Co., Ltd.; 1H-360S), 2 cc of the coating composition (E) was sucked with a plastic dropper and was dropped onto the surface of the figured glass for coating. Subsequently, the coating composition (A1) was applied thereon in the same manner. Thereafter, the resultant figured glass was baked in the air, thereby obtaining an article containing a low-reflection film formed thereon. The article was evaluated. The result is listed in Table 2 below.

TABLE 1

| Example | Coating Composition | Binder Solution (i) Amount [g] | Fine particle Dispersion Fine particles | Dispersion | Amount [g] | SiO$_2$ Material [g] Tetraethoxy-silane | 61% by mass Nitric Acid | Ion-Exchanged Water | Amount of Solvent, etc. [g] Denatured Ethanol | 2-Butanol | DAA | α-Terpineol |
|---|---|---|---|---|---|---|---|---|---|---|---|---|
| 4 | A1 | — | — | — | — | 7.6 | 0.1 | 6.6 | 85.7 | — | — | — |
|   | B1 | — | Hollow SiO$_2$ | (ii) | 5.3 | — | — | — | 55.7 | 24 | 15 | — |
|   | C1 | 16.4 | Chain SiO$_2$ | (iii) | 3.5 | — | — | — | 40.1 | 24 | 15 | 1 |
| 6 | A1 | — | — | — | — | 7.6 | 0.1 | 6.6 | 85.7 | — | — | — |
|   | B2 | 5.9 | Hollow SiO$_2$ | (ii) | 5.3 | — | — | — | 49.8 | 24 | 15 | — |
|   | C1 | 16.4 | Chain SiO$_2$ | (iii) | 3.5 | — | — | — | 40.1 | 24 | 15 | 1 |
| 7 | A1 | — | — | — | — | 7.6 | 0.1 | 6.6 | 85.7 | — | — | — |
|   | E | — | TiO$_2$ | (iv) | 1.0 | — | — | — | 60.0 | 24 | 15 | — |

DAA: Diacetone Alcohol

TABLE 2

| | | Refractive Index | | | Bottom | Average | Difference in |
|---|---|---|---|---|---|---|---|
| Example | Coating Composition | First Layer | Second Layer | Third Layer | Reflectance [%] | Reflectance [%] | Transmittance from Uncoated Glass [%] |
| 4 | A1/B1/C1 | 1.48 | 1.31 | 1.39 | 0.5 | 0.7 | 2.6 |
| 5 | A1/B1/C1 | 1.48 | 1.31 | 1.39 | 0.6 | 0.7 | 2.7 |
| 6 | A1/B2/C1 | 1.48 | 1.32 | 1.39 | 0.6 | 0.8 | 2.6 |
| 7 | E/A1 | 2.5 | 1.48 | — | 0.3 | 1.9 | — |

It is understood, from the results listed in Table 2, that the articles of Examples 4 to 6 each containing the low-reflection film having the three-layered structure consisting of the first layer, the second layer and the third layer laminated in this order from the base material side, and respectively having a refractive index n1 of the first layer, a refractive index n2 of the second layer and a refractive index n3 of the third layer satisfying the relationship of n1>n3>n2 have low bottom reflectance (namely, the minimum reflectance against light of a wavelength of 400 to 1100 nm), and have a small difference between the bottom reflectance and the average reflectance (namely, wavelength dependency of the reflectance). Furthermore, in the articles of Examples 4 to 6, unevenness in reflection was minimally conspicuous in visual examination for the appearance.

It is also understood that the article of Example 7 containing the low-reflection film with a two-layered structure has a large difference between the bottom reflectance and the average reflectance (namely, wavelength dependency of the reflectance).

While the invention has been described in detail and with reference to specific embodiments thereof, it will be apparent to one skilled in the art that various changes and modifications can be made therein without departing from the spirit and scope thereof.

The present application is based on Japanese Patent Application No.2009-205869 filed on Sep. 7, 2009, and the entire contents are incorporated herein by reference.

INDUSTRIAL APPLICABILITY

The article of the invention is useful as articles, which equip an antireflection function in order to decreasing a reflection of outside light and improving a light transmittance, such as a cover glass of a solar battery, various displays (LCD, PDP, organic EL, CRT, SED, etc.) and their front plates, a windowpane for various vehicles (automobile, train, airplane, etc.), a windowpane for constructions, a cover glass of a touch panel and the like.

| DESCRIPTION OF REFERENCE NUMERALS | |
|---|---|
| 10 | article |
| 12 | base material |
| 14 | low-reflection film |
| 16 | first layer |
| 18 | second layer |
| 20 | third layer |

The invention claimed is:

1. An article, comprising:
a base material and
a low-reflection film on a surface of the base material,
wherein the low-reflection film comprises a first layer, a second layer, and a third layer disposed in this order from the surface of the base material, and
the first layer has a refractive index n1 of 1.50 or less,
the second layer has a refractive index n2 of 1.30 or less,
the third layer has a refractive index n3 of 1.40 or less, and
n1, n2, and n3 satisfy a relationship n1>n3>n2.

2. The article according to claim 1, wherein the first layer, the second layer and the third layer have a thickness d1, a thickness d2 and a thickness d3, respectively, which satisfy a relationship d1>d2>d3.

3. The article according to claim 1, wherein the first layer comprises a burned substance of a hydrolysate of alkoxysilane.

4. The article according to claim 1, wherein the second layer comprises a fine particle, a pyrolytic resin, or any combination thereof.

5. The article of claim 4, wherein the second layer consists of hollow silica fine particles.

6. The article of claim 1, wherein the third layer is formed directly on the second layer.

7. The article according to claim 1,
wherein the third layer comprises a fine particle, a pyrolytic resin, or any combination thereof, and
wherein the third layer further comprises a binder.

8. The article according to claim 1, wherein the low-reflection film has a lowest reflectance against light of a wavelength of 400 to 1100 nm being 1.0% or less.

9. The article according to claim 1, wherein the base material is a transparent base material.

10. The article of claim 1, wherein the second layer is formed directly on the first layer.

11. The article of claim 10, wherein the third layer is formed directly on the second layer.

12. The article of claim 1, further comprising another functional layer.

13. The article of claim 1, consisting of the base material and the low-reflection film.

14. The article according to claim 1, wherein the article is a cover glass of a solar battery.

15. An article, comprising:
a base material and
a low-reflection film comprising at least three layers on the base material,
wherein a first layer with a refractive index higher than any refractive index of any other layer in the low-reflection film is closer to the base material than any other layer in the low-reflection film,
an outermost layer with a refractive index higher than any refractive index of any other layer in the low-reflection film except for the first layer is farther from the base material than any other layer in the low-reflection film,
the first layer has a refractive index of 1.50 or less,
the outermost layer has a refractive index of 1.40 or less, and
a layer of the low-reflection film between the first layer and the outermost layer has a refractive index of 1.30 or less.

16. The article according to claim 15, wherein the first layer comprises a burned substance of a hydrolysate of alkoxysilane.

17. The article according to claim 15,
wherein the outermost layer comprises a fine particle, a pyrolytic resin, or any combination thereof, and
the outermost layer further comprises a binder.

18. The article according to claim 15, wherein the low-reflection film has a lowest reflectance against light of a wavelength of 400 to 1100 nm being 1.0% or less.

19. The article according to claim 15, wherein the base material is a transparent base material.

20. The article according to claim 15, wherein the article is a cover glass of a solar battery.

* * * * *